(12) United States Patent
Ivanov

(10) Patent No.: US 9,425,780 B1
(45) Date of Patent: Aug. 23, 2016

(54) APPARATUS AND METHODS FOR ANTI-ALIASING IN ELECTRONIC CIRCUITS

(71) Applicant: Analog Devices, Inc., Norwood, MA (US)

(72) Inventor: Evgueni Ivanov, Lexington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/675,370

(22) Filed: Mar. 31, 2015

(51) Int. Cl.
*H05K 5/00* (2006.01)
*H03K 5/26* (2006.01)
*G11C 27/02* (2006.01)

(52) U.S. Cl.
CPC . *H03K 5/26* (2013.01); *G11C 27/02* (2013.01)

(58) Field of Classification Search
CPC .................................. H03K 5/26; G11C 27/02
See application file for complete search history.

(56) References Cited

U.S. PATENT DOCUMENTS

| | | | | |
|---|---|---|---|---|
| 5,970,110 A * | 10/1999 | Li | ............................. | G06F 7/68 327/115 |
| 7,714,760 B2 * | 5/2010 | Petrovic | ............... | H04B 1/0039 341/155 |
| 8,421,891 B2 * | 4/2013 | Morikawa | ........... | H03M 1/0624 341/155 |
| 8,797,200 B2 * | 8/2014 | Goulier | ................. | H03M 3/346 341/143 |
| 2013/0141264 A1 * | 6/2013 | Wan | ........................ | H03N 3/34 341/143 |

FOREIGN PATENT DOCUMENTS

| | | |
|---|---|---|
| CN | 102355240 A | 2/2012 |
| JP | 07177408 A | 7/1995 |
| JP | 2011250459 A | 12/2011 |

* cited by examiner

*Primary Examiner* — Jung Kim
(74) *Attorney, Agent, or Firm* — Knobbe, Martens, Olson & Bear, LLP

(57) ABSTRACT

A circuit operating with a switching clock signal and a sampling clock signal can have one or more of its switching and sampling clock signals periodically phase-reversed. The period of phase reversal can be greater than twice the period of the original switching and/or sampling clock signal, and in certain configurations the switching and sampling clock signals can be synchronized. With a selection of phase reversal period (or frequency), aliasing frequency components of the mixed signal from the switching and sampling clock signals can be removed.

20 Claims, 9 Drawing Sheets

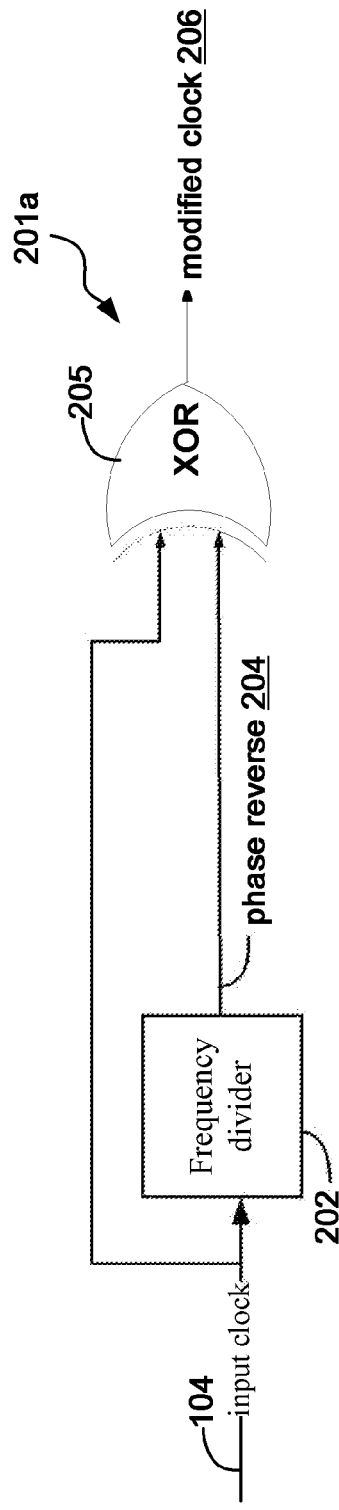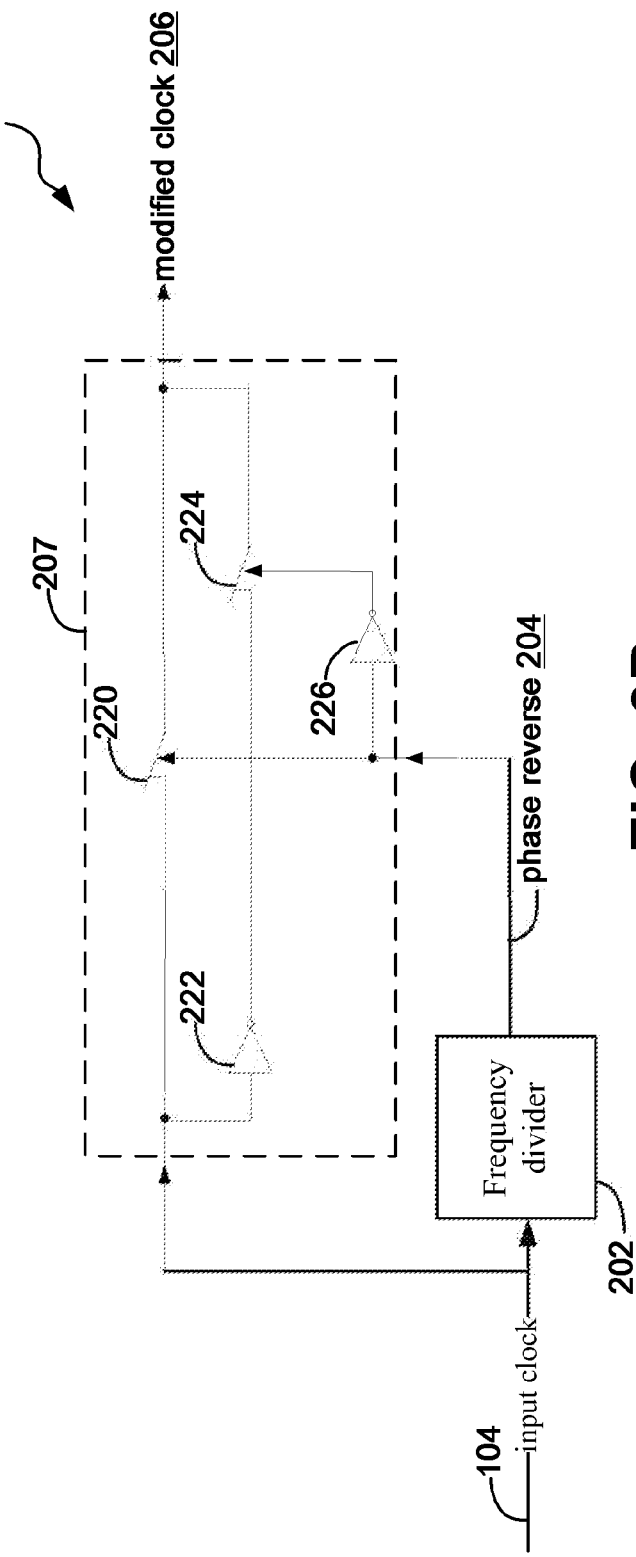
FIG. 2A
FIG. 2B

APPARATUS AND METHODS FOR ANTI-ALIASING IN ELECTRONIC CIRCUITS

BACKGROUND

1. Field

The described technology generally relates to electronics, more specifically to anti-aliasing in electronic circuits.

2. Description of the Related Art

Modern circuits such as amplifiers often use clocked-controlled switches. Including clock-controlled switches in an electronic circuit can be useful for a variety of purposes. In one example, an amplifier can use switches for chopping or auto-zeroing operations of the amplifier.

The output of an electronic circuit that includes clock-controlled switches can be subsequently sampled. Sampling the electronic circuit's output can undesirably result in aliasing.

SUMMARY

Each of the methods and devices of the described technology has several aspects, no single one of which is solely responsible for its desirable attributes.

In one embodiment, an apparatus includes a switching circuit configured to receive a first clock signal and to generate an output signal, wherein the switching circuit includes a first switch configured to receive the first clock signal, wherein the first clock signal is configured to control a switching operation of the switching circuit. The apparatus further includes a sampling circuit configured to receive a second clock signal and the output signal, wherein the sampling circuit includes a second switch configured to receive the second clock signal, wherein the second clock signal is configured to control a sampling operation of the sampling circuit. The apparatus further includes a first clock modification circuit configured to receive a first input clock signal and to generate a first modified clock signal by periodically reversing a phase of the first input clock signal, wherein the first modified clock signal comprises either the first clock signal or the second clock signal.

In another embodiment, a method includes receiving a first clock signal as an input to a switching circuit, controlling a switching operation of the switching circuit using the first clock signal, generating an output signal of the switching circuit based on the switching operation, receiving a second clock signal and the output signal as inputs to a sampling circuit, and controlling a sampling operation of the sampling circuit using the second clock signal. The method further includes generating a first modified clock signal based on periodically reversing a phase of a first input clock signal, wherein the first modified clock signal comprises either the first clock signal or the second clock signal.

In another embodiment, an apparatus includes a means for receiving a first clock signal, wherein the first clock signal is configured to control a switching operation, a means for generating an output signal from the switching operation based in part on the first clock signal, and a means for receiving a second clock signal and the output signal, wherein the second clock signal is configured to control a sampling operation. The apparatus further includes a means for receiving a first input clock signal and periodically reversing a phase of the first input clock signal to generate a first modified clock signal, wherein the first modified clock signal comprises either the first clock signal or the second clock signal.

BRIEF DESCRIPTION OF THE DRAWINGS

These drawings and the associated description herein are provided to illustrate specific embodiments of the described technology and are not intended to be limiting.

FIG. 2A is a schematic block diagram illustrating the clock modification circuit of FIGS. 1A-1C according to one embodiment.

FIG. 2B is a schematic block diagram illustrating the clock modification circuit of FIGS. 1A-1C according to another embodiment.

DETAILED DESCRIPTION OF EMBODIMENTS

Figure 1A:
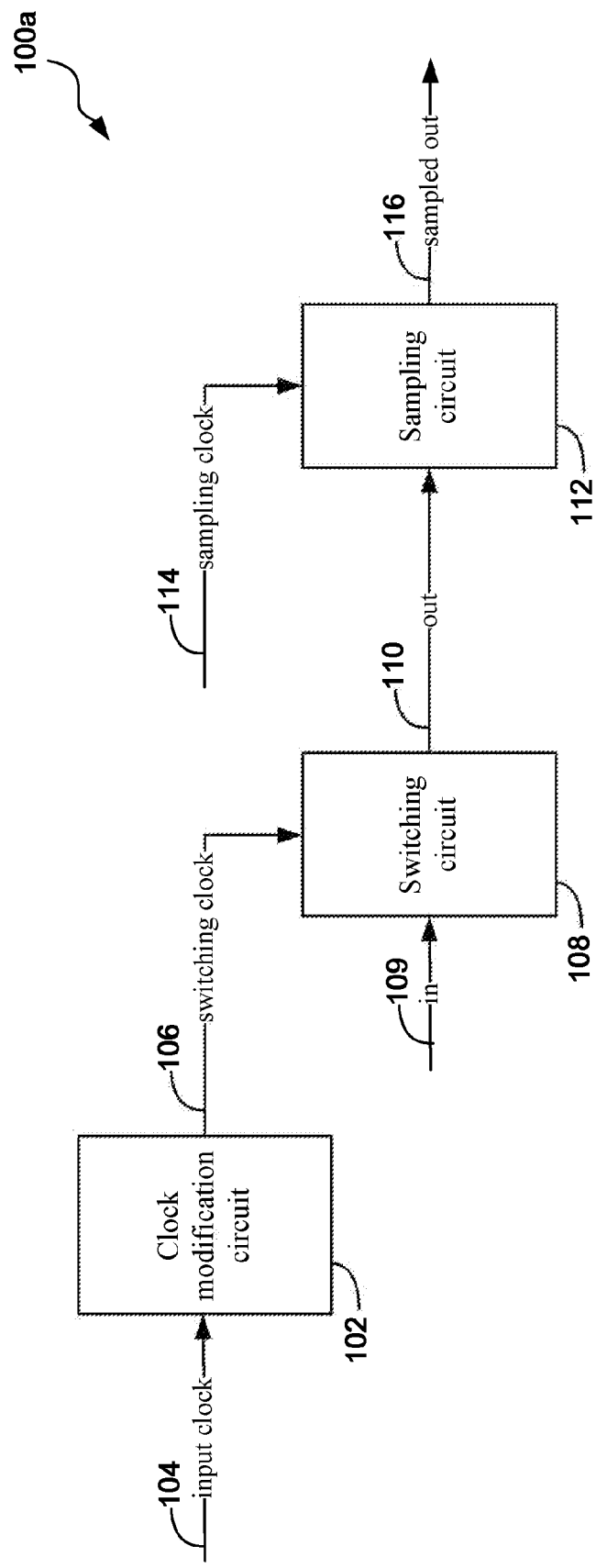
FIG. 1A is a schematic block diagram illustrating an example anti-aliasing circuit according to one embodiment.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Various analog electronic systems can operate in part using clock-controlled switches. In one example, a chopper amplifier includes input chopping switches for modulating an input signal with a chopping clock signal before it is provided to amplification circuitry, and output chopping switches for demodulating the amplified signal generated by the amplification circuitry. In another example, an auto-zero amplifier includes auto-zero switches for controlling operation of an amplifier between an auto-zero phase and an amplification phase. Other examples of electronic circuits using switches controlled by a switching clock signal include switching regulators, data converters, and switched capacitor circuits.

Although using clock-controlled switches in an electronic circuit can be useful in a variety of applications, inclusion of such switches can also degrade performance. For instance, when the switches are implemented using field-effect transistors (FETs) having gates controlled by a switching clock signal, displacement currents can flow through parasitic gate to source and/or gate to drain capacitors in response to rising or falling edges of the switching clock signal. Such coupling can lead to clock feed-through and/or charge injection.

Accordingly, including clock-controlled switches in an electronic circuit can result in an output signal generated by the electronic circuit having ripples or glitches at the fundamental frequency of the switching clock signal and its harmonic frequencies. Although the fundamental frequency of the switching clock signal can be chosen to be higher than the bandwidth of the output signal, when the output signal of the amplifier is subsequently sampled by an analog-to-digital converter (ADC) or other sampling circuitry, the ripples from the clock signal can be aliased to lower frequencies and degrade signal integrity.

In certain configurations, a sampling clock signal can be synchronized with the switching clock signal used by the clock-controlled switches to increase the predictability of the aliasing. However, such a configuration may further exacerbate the problems of aliasing by making the fundamental frequency of the switching clock signal or one of its harmonics about equal to the fundamental frequency of the sampling clock signal or one of its harmonics. As persons having ordinary skill in the art will appreciate, such a configuration can alias clock ripples to DC, thereby undesirably generating a DC offset.

An ADC or other sampling circuitry can include an anti-aliasing filter at its input to alleviate aliasing. However, an anti-aliasing filter alone may be insufficient to suppress aliasing in high precision signal processing systems. For instance, when the output signal from a switching circuit includes clock ripples with 100-200 μV of amplitude and the anti-aliasing filter suppresses the ripples by a factor of 10, the filtered signal outputted by the anti-aliasing filter can nevertheless include clock ripples with an amplitude of 10-20 μV. Such ripples can be directly aliased to DC or a low-frequency band by sampling, thereby degrading signal integrity and/or generating a DC offset of about 10-20 μV.

The amplitude of the clock ripples in an output signal can change with a variety of parameters, including, for example, temperature, input common-mode voltage, supply voltage, process, and/or load current. The change in the clock ripple's amplitude can exacerbate the complexity of implementing an anti-aliasing filter and/or can significantly degrade offset voltage ($V_{OS}$) drift, common-mode rejection ration (CMRR), and/or power supply rejection ratio (PSRR) performance.

Apparatus and methods for anti-aliasing in electronic circuits are provided herein. In certain configurations, a circuit operating with a switching clock signal and a sampling clock signal can have one or more of its switching and sampling clock signals periodically phase-reversed. The period of phase reversal can be greater than twice the period of the original switching and/or sampling clock signal. In certain configurations, the switching and sampling clock signals can be synchronized. With a selection of phase reversal period (or frequency), aliasing components (e.g., the DC component and/or low frequency components) of the mixed signal from the switching and sampling clock signals can be removed.

In one example, problems associated with clock aliasing can be alieved by periodically reversing the phase of a switching clock signal with a reversing frequency $F_{REV}$ about equal to the frequency of the switching clock signal $F_{CLK}$ divided by N, where N is a factor greater than 2. As skilled artisans will appreciate, the phase modulation can cancel spectral components at certain harmonics of $F_{REV}$ and generate sideband harmonics at the frequencies $[F_{CLK}+(2j+1)F_{CLK}]$, where j is an integer ( . . . −2, −1, 0, 1, 2, . . . ).

As skilled artisans will appreciate, ripples of a switching clock signal in an output signal can mix with a sampling clock signal, thereby causing aliasing. Without clock phase reversal, aliasing can occur at aliasing frequencies $F_{ALIAS}$ about equal to $k*F_{SAMPLE}-m*F_{CLK}$, where k and m are integers greater than or equal to 1, $F_{SAMPLE}$ is the frequency of the sampling clock signal, and $F_{CLK}$ is the frequency of the switching clock signal. Some of the aliasing frequencies $F_{ALIAS}$ can be located at low frequencies or at DC, which can degrade signal integrity and/or generate DC offset. However, by providing phase reversal with a reversing frequency $F_{REV}$, the aliasing frequencies $F_{ALIAS}$ can effectively be modulated, thereby up-converting aliasing to $F_{ALIAS}+F_{REV}$. When the upconverted aliasing frequencies $F_{ALIAS}+F_{REV}$ are beyond the bandwidth of the signal being measured or sampled, aliasing associated with ripples of the switching clock signal should not interfere with the signal of interest.

Although the example above describes phase reversal in the context of reversing the phase of the switching clock signal, the teachings herein are also applicable to configurations in which phase reversal is applied to the sampling clock signal but not to the switching clock signal and also to configurations in which phase reversal is applied to both the sampling clock signal and the switching clock signal. In certain configurations, when phase reversal is applied to both the sampling clock signal and the switching clock signal, the frequencies of the phase reversals are selected to be different.

The teachings herein can be used to enhance performance of an electronic system by shifting aliased tones outside the baseband of the signal of interest. Thus, the electronic system can operate with enhanced performance, including, for example, smaller DC offset, better CMRR, better PSRR, and/or higher signal integrity. In certain configurations, phase reversal can alleviate a need for an anti-aliasing filter and/or relax design constraints of the anti-aliasing filter, thereby decreasing the electronic system's complexity, size, power consumption, and/or cost.

The anti-aliasing reduction schemes described herein can be used in a wide variety of electronic systems and applications. For instance, in one example, an amplifier such as a chopper and/or auto-zero amplifier operates using switches that are controlled by a switching clock signal, and the output of the amplifier is sampled by an ADC or other sampling circuitry that is controlled by a sampling clock signal. In such a configuration, the switching clock signal and/or the sampling clock signal can be configured to operate with periodic phase reversal in accordance with the teachings herein. In another example, a switched power converter, such as buck converter, a boost converter, or a charge pump, can generate a regulated supply voltage based on a switching clock signal. Additionally, a sampling circuit can be powered in part by the regulated supply voltage, and sampling operations of the sampling circuit can be controlled by a sampling clock signal. In such configurations, the switching clock signal and/or the sampling clock signal can be configured to operate with periodic phase reversal in accordance with the teachings herein.

As described herein, same numerical references in FIGS. 1A-3C may indicate same, substantially similar, or corresponding features, elements, components, or functions.

FIG. 1A is a schematic block diagram illustrating an example anti-aliasing circuit according to one embodiment. The illustrated anti-aliasing circuit 100a includes a clock modification circuit 102, a switching circuit 108, and a sampling circuit 112. The clock modification circuit 102 may receive an input clock signal 104 and generate a switching clock signal 106, which can be provided to the switching circuit 108. The switching circuit 108 may receive an input signal 109 and the switching clock signal 106, and provides an output signal 110 to the sampling circuit 112. The sampling circuit 112 may receive the output signal 110 from the switching circuit 108 and a sampling clock signal 114, and generate a sampled out signal 116.

Still referring to FIG. 1A, the clock modification circuit 102 is configured to accept an input signal, such as the input clock signal 104, and produce an output signal, such as the switching clock signal 106. The output signal of the clock modification circuit 102 is a modified clock signal generated based on the input clock signal 104. The clock modification circuit 102 can periodically reverse the input clock signal 104 to produce the modified clock signal. In one embodiment, the period of reversing the input clock signal 104 can be selected to be an integer multiple of the period of the input clock signal 104. In such embodiments, the frequency of the input clock signal 104 would be an integer multiple of the frequency of reversing the input clock signal 104. For example, if the frequency of the input clock signal 104 is $F_{CLK}$, the frequency of reversing the input clock signal 104, $F_{REV}$, can be $F_{CLK}/N$, where N can be an integer factor greater than 2. It can be advantageous to have the factor N to be a power of 2 greater than 2 (e.g., 4, 8, 16, etc.) to generate the periodically phase-reversed signal. In other embodiments, the factor N can be a non-integer, which can be implemented with fractional division circuits, for example. The clock modification circuit 102 can be implemented in various ways, some of which are described in further detail in connection with FIGS. 2A-2B below.

Still referring to FIG. 1A, the switching circuit 108 can be a clocked circuit performing a switching operation based on a clock signal, such as the switching clock signal 106. The switching circuit 108 can receive the switching clock signal 106 from the clock modification circuit 102 to perform its switching operation. In some embodiments, the switching circuit 108 can be an amplifier, buffer, or active filter that is clocked to apply chopping, auto-zeroing, or switching of capacitors (e.g., as in a switched-capacitor circuit). In other embodiments, the switching circuit 108 can be a power supply that supplies power to one or more blocks of a signal processing system and that uses switching operation, such as DC/DC converter, charge pump, etc. generating local voltages different from an external supply voltage, for example.

In one embodiment, the switching circuit 108 includes one or more field effect transistors (FETs), such as metal oxide semiconductor (MOS) transistors. Additionally, the gates of the FETs can be controlled by the switching clock signal 106, and the FETs can operate in a signal path of the switching circuit 108. Furthermore, parasitic gate-to-source and/or gate-to-drain capacitors of the FETs can generate charge injection and/or clock coupling, which can result in clock ripple in the output signal 110 at the fundamental frequency of the switching clock signal 106 and at harmonics thereof.

Still referring to FIG. 1A, the sampling circuit 112 can be a clocked circuit performing sampling of its input signal (corresponding to the output signal 110 in this example) based on a clock signal, such as the sampling clock signal 114. The sampling circuit 112 can receive the output signal 110 from the switching circuit 108 and generate the sampled out signal 116 based on the sampling clock signal 114. In some embodiments, the sampled out signal 116 may be a sampled version of the output signal 110. In other embodiments the sampled out signal 116 may be a sampled version of another input (not shown in FIG. 1A) to the sampling circuit 112, and the output signal 110 may serve as a supply voltage to the sampling circuit 112. The sampling circuit 112 can include sampling components, which can be used, for example, in an analog-to-digital converter (ADC) such as pipeline, algorithmic, sigma-delta, successive approximation register (SAR), and other types of ADCs, and switched-capacitor circuits such as active switched-capacitor filters and sample-and-hold circuits. Some example implementations of the switching circuit 108 and the sampling circuit 112 are further discussed in connection with FIGS. 3A-3C below.

In the embodiment illustrated in FIG. 1A, the modified clock signal generated by the clock modification circuit 102 is provided to the switching circuit 108 as the switching clock signal 106. As further discussed below in connection with FIGS. 1B-1C, the modified clock signal output from the clock modification circuit 102 can be used as a clock signal for a different clocked circuit such as the sampling circuit 112. Periodically reversing the phase of the input clock signal 104 in the clock modification circuit 102 can advantageously alter the frequency domain characteristics to remove aliasing. For example, periodically reversing the input clock signal's phase can shift aliased tones outside the baseband of the signal of interest. Frequency and time domain signal graphs of an example implementation are described in further detail in connection with FIGS. 4A-4B below.

In certain configurations, the switching clock signal 106 can be synchronized with the sampling clock signal 114, such that the aliased tones will have predictable and stable frequencies. However, in other configurations the switching clock signal 106 and the sampling clock signal 114 can be unsynchronized.

Figure 1B:
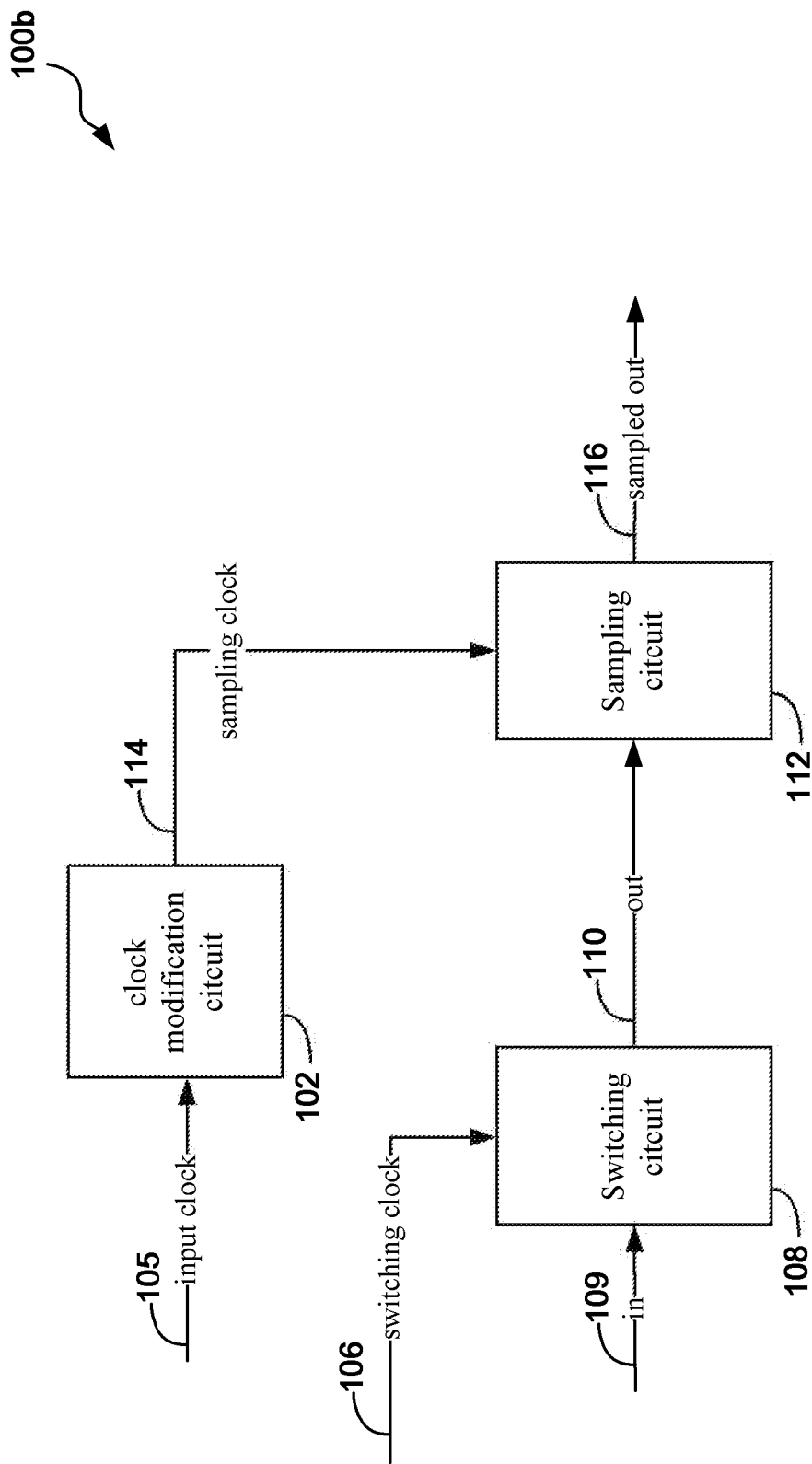
FIG. 1B is a schematic block diagram illustrating an example anti-aliasing circuit according to another embodiment.

FIG. 1B is a schematic block diagram illustrating an example anti-aliasing circuit according to another embodiment. The illustrated anti-aliasing circuit 100b includes the clock modification circuit 102, the switching circuit 108, and the sampling circuit 112. In the embodiment illustrated in FIG. 1B, the clock modification circuit 102 receives and modifies the input clock signal 105 to output the sampling clock signal 114 to the sampling circuit 112. Thus, the illustrated configuration provides phase reversal to the sampling clock signal 114 rather than to the switching clock signal 106. Additional details of the anti-aliasing circuit 100b of FIG. 1B can be similar to those of the anti-aliasing circuit 100a of FIG. 1A.

Figure 1C:
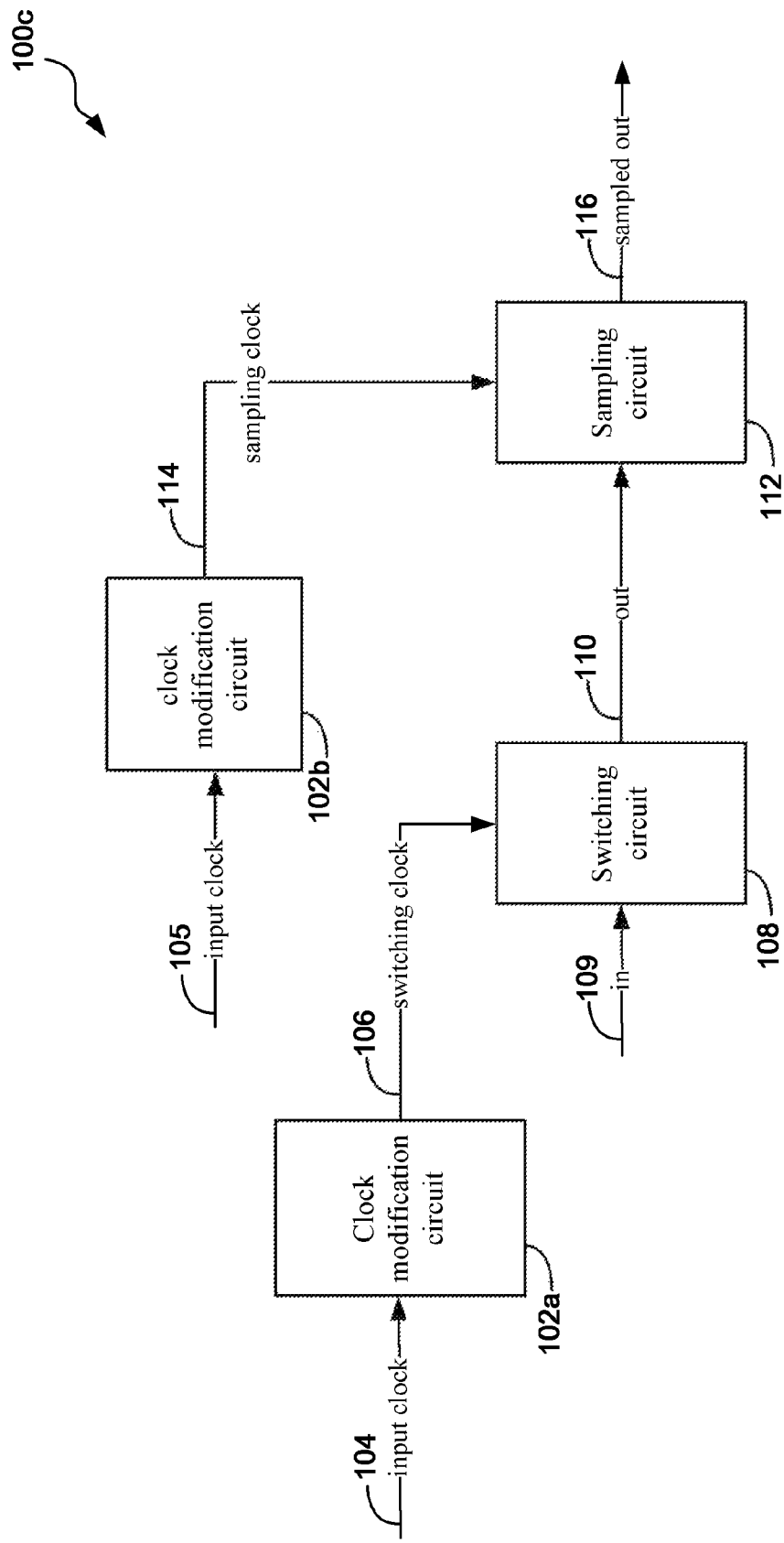
FIG. 1C is a schematic block diagram illustrating an example anti-aliasing circuit according to another embodiment.

FIG. 1C is a schematic block diagram illustrating an example anti-aliasing circuit according to another embodiment. The illustrated anti-aliasing circuit 100c includes a first clock modification circuit 102a, a second clock modification circuit 102b, the switching circuit 108, and the sampling circuit 112. The first clock modification circuit 102a may receive the input clock signal 104 and output the switching clock signal 106 to the switching circuit 108. The second clock modification circuit 102b may receive a second input clock signal 105 and output the sampling clock signal 114 to the sampling circuit 112.

In the embodiment illustrated in FIG. 1C, the frequency of reversing the input clock 104 in the first clock modification circuit 102a and the frequency of reversing the second input clock 105 in the second clock modification circuit 102b can be different to remove aliasing and to ensure that any aliased tones are shifted outside the baseband of the signal of interest. Additional details of the anti-aliasing circuit 100c of FIG. 1C can be as described earlier.

FIG. 2A is a schematic block diagram illustrating the clock modification circuit of FIGS. 1A-1C according to one embodiment. The clock modification circuit 201a may be an example embodiment of the clock modification circuit 102 (FIGS. 1A-1B), the first clock modification circuit 102a (FIG. 1C), and the second clock modification circuit 102b (FIG. 1C). The illustrated clock modification circuit 201a includes the input clock signal 104, a frequency divider 202, a phase reverse signal 204, an exclusive OR (XOR) circuit 205, and a modified clock signal 206.

In the illustrated configuration, the frequency divider 202 generates the phase reverse signal 204 by dividing the input clock signal 104 by a factor of N. The frequency divider 202 is an example implementation of a phase reversal circuit, which is configured to generate the phase reverse signal 204. In other embodiments, other appropriate circuitry may be used to implement the phase reversal circuit that provides the phase reverse signal 204. The clock modification circuit 201a generates the modified clock signal 206 based on an XOR operation of the phase reverse signal 204 and the input clock signal 104. Although the examples in FIGS. 2A-2B illustrate generating the modified clock signal 206 with a signal indicating phase reversal (e.g., the phase reverse signal 204) followed by a logic circuitry (e.g., the XOR circuit 205), a person of ordinary skill in the art can implement the clock modification circuit 102 (FIGS. 1A-1B), 102a, 102b (FIG. 1C) using other intermediate signals and circuit elements to generate the modified clock signal 206 from the input signal 104.

In embodiments having the phase-reversal signal factor that is a power of 2 greater than 2 (e.g., 4, 8, etc.), the frequency divider 202 can be implemented with cascading flip-flops, for example. For instance, two or more D flip-flops can be arranged in a cascade, with the input and the output of a particular flip-flop electrically connected to one another via an inverting digital feedback loop. Additionally, the clock input of the first D flip-flop in the cascade can receive the input clock signal 104, and the output of the first D flip-flop can be provided to the clock input of the second D flip-flop. Likewise, the output of the second D flip-flop can be provided to the clock input of the third D flip-flop, and so on. The output of the last D-flip flop in the cascade can generate the modified clock signal 206.

FIG. 2B is a schematic block diagram illustrating the clock modification circuit of FIGS. 1A-1C according to another embodiment. The clock modification circuit 201b may be an example embodiment of the clock modification circuit 102 (FIGS. 1A-1B), the first clock modification circuit 102a (FIG. 1C), and the second clock modification circuit 102b (FIG. 1C). The illustrated clock modification circuit 201b includes the input clock signal 104, the frequency divider 202, the phase reverse signal 204, a logic circuit 207, and the modified clock signal 206. The logic circuit 207 illustrated in FIG. 2B includes a first inverter 222, a second inverter 226, a first switch 220, and a second switch 224.

The logic circuit 207 can include elements such as multiple inverters and switches to generate the modified clock signal 206 from the input clock signal 104 and the phase reverse signal 204. The logic circuit 207 may include elements other than the ones illustrated in FIG. 2B to perform the same logic function. In some embodiments, the combination of the frequency divider 202 and the XOR circuit 205 of FIG. 2A and the combination of the frequency divider 202 and the logic circuit 207 of FIG. 2B can be implemented with other elements to generate the modified clock signal 206, which has periodically reversed phase compared to the input clock 104. Time domain signal graph of an example implementation illustrating the modified clock signal 206 is further discussed in connection with FIG. 4B below.

Figure 3A:
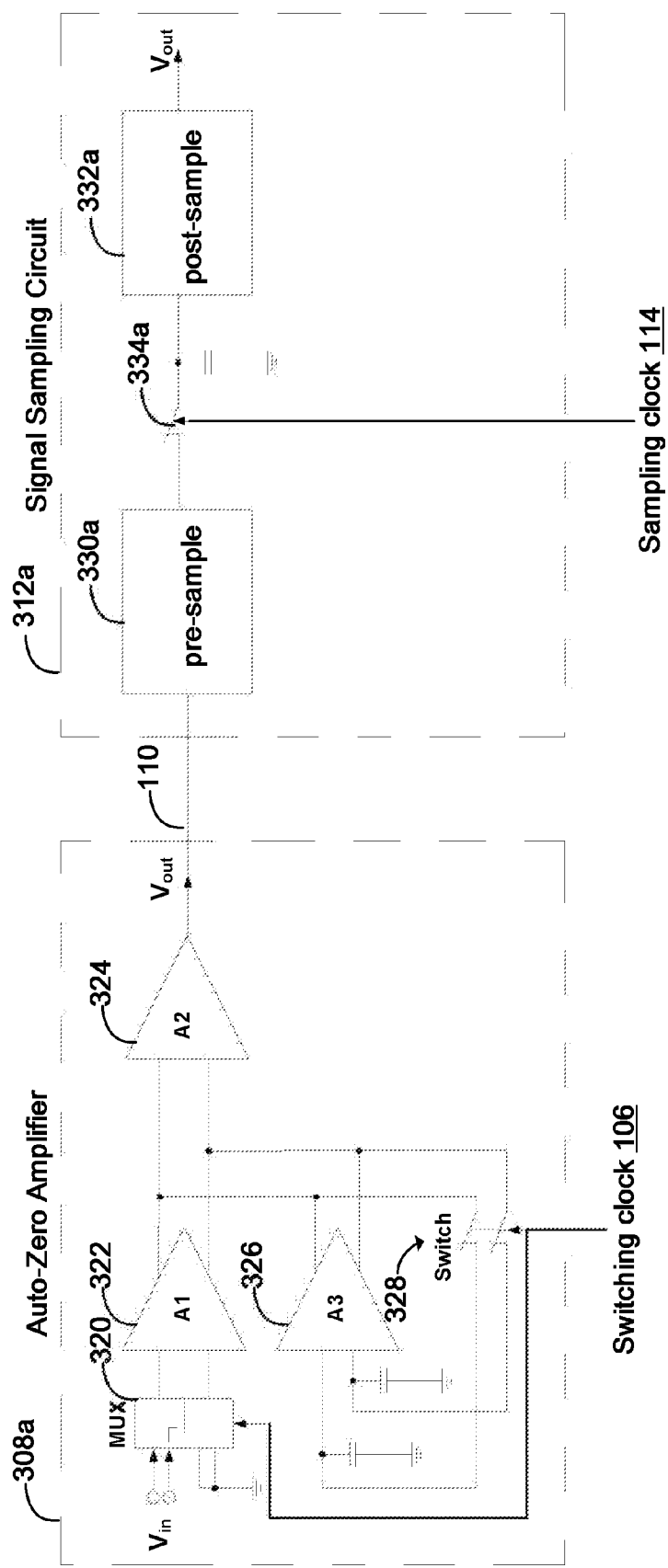
FIG. 3A is an example implementation of the anti-aliasing circuit according to one embodiment.

FIG. 3A is an example implementation of the anti-aliasing circuit according to one embodiment. The example implementation illustrated in FIG. 3A includes an auto-zero amplifier 308a, which may be an example of the switching circuit 108 (FIGS. 1A-1C). Additionally, the example implementation illustrated in FIG. 3A includes a signal sampling circuit 312a, which may be an example of the sampling circuit 112 (FIGS. 1A-1C). Also, the output $V_{out}$ of the signal sampling circuit 312a can be an example of the sampled out signal 116 (FIGS. 1A-1C). The auto-zero amplifier 308a illustrated in FIG. 3A includes a multiplexer 320, a first amplifier 322, a second amplifier 324, a third amplifier 325, and switches 328. The signal sampling circuit illustrated in FIG. 3A includes a pre-sample circuit 330a, a post-sample circuit 332a, and a sampling switch 334a.

An amplifier, such as an operational amplifier or an instrumentation amplifier, can include auto-zero circuitry for reducing the amplifier's input offset voltage or reduce flicker noise, for example. In certain implementations an auto-zero amplifier can include a primary amplifier, an auxiliary amplifier, and a capacitor, and the auxiliary amplifier can operate during an auto-zero phase to store a voltage across the capacitor to correct for the input offset voltage of the primary amplifier. The auto-zero amplifier 308a illustrated in FIG. 3A receives the switching clock signal 106, which may or may not be the modified clock signal 206 (FIGS. 2A-2B) based on the implementations discussed in connection with FIGS. 1A-1C. The auto-zero amplifier 308a may perform its switching operation between auto-zero and amplifying phases based on the switching clock signal 106. In this example, the auto-zero circuitry including the auxiliary amplifier A3 is configured to perform auto-zero function as the switches open and close according to the switching clock signal 106. The signal sampling circuit 312a can include pre- and post-sample circuitries, and the sampling can take place according to the sampling clock 114.

Figure 3B:
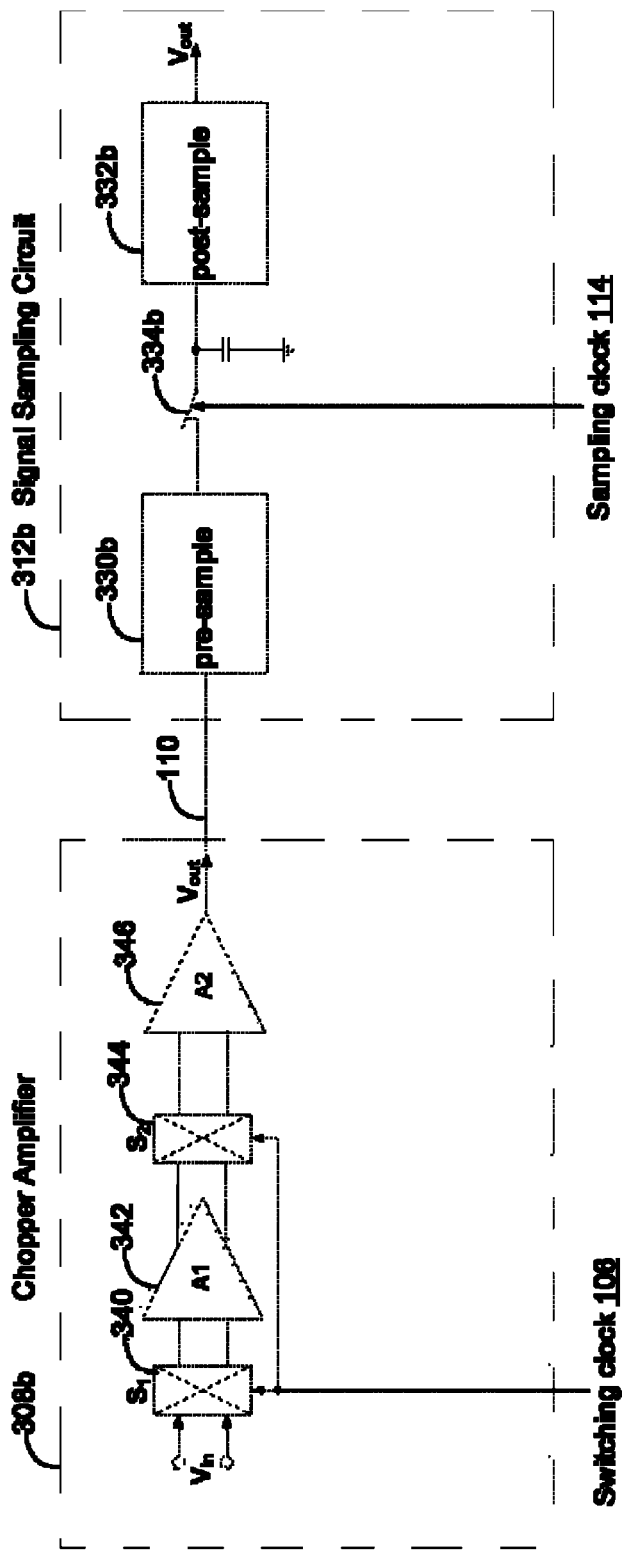
FIG. 3B is another example implementation of the anti-aliasing circuit according to one embodiment.

FIG. 3B is another example implementation of the anti-aliasing circuit according to one embodiment. The example implementation illustrated in FIG. 3B includes a chopper amplifier 308b, which may be an example of the switching circuit 108 (FIGS. 1A-1C), and a signal sampling circuit 312b, which may be an example of the sampling circuit 112 (FIGS. 1A-1C). An amplifier, such as an operational amplifier or instrumentation amplifier, can include chopper circuitry for reducing the amplifier's input offset voltage. For certain applications, such as high-precision amplification, it can be desirable for an amplifier to have low input offset. The chopper amplifier 308b illustrated in FIG. 3B includes a first chopper 340, a first amplifier 342, a second chopper 344, and a second amplifier 346. The signal sampling circuit illustrated in FIG. 3B includes a pre-sample circuit 330b, a post-sample circuit 332b, and a sampling switch 334b.

For example, in a chopper amplifier, input chopping switches (S1 in this example) can be used to chop or modulate the amplifier's input signal during an input chopping operation, thereby up-shifting the frequency of the amplifier's input signal. Additionally, the amplifier can include a filter for filtering the amplifier's input offset, which can be separated in frequency from the chopped input signal. The amplifier can further include output chopping switches (S2 in this example) for demodulating or down-shifting the frequency of the chopped input signal during an output chopping operation. The chopper amplifier 308b illustrated in FIG. 3B receives the switching clock signal 106, which may or may not be the modified clock signal 206 (FIGS. 2A-2B) based on the implementations discussed in connection with FIGS. 1A-1C. The chopper amplifier 308b may perform chopping at its input and output chopping switches (S1 and S2 respectively) according to the switching clock 106.

Although FIG. 3A illustrates an auto-zero amplifier and FIG. 3B illustrates a chopping amplifier, the teachings herein are also applicable to amplifiers that employ both auto-zeroing and chopping. Additionally, although FIG. 3A and FIG. 3B illustrate specific implementations of auto-zero and chopping amplifiers, the teachings herein are applicable to auto-zero and/or chopping amplifiers implemented using a wide variety of amplifier topologies.

Figure 3C:
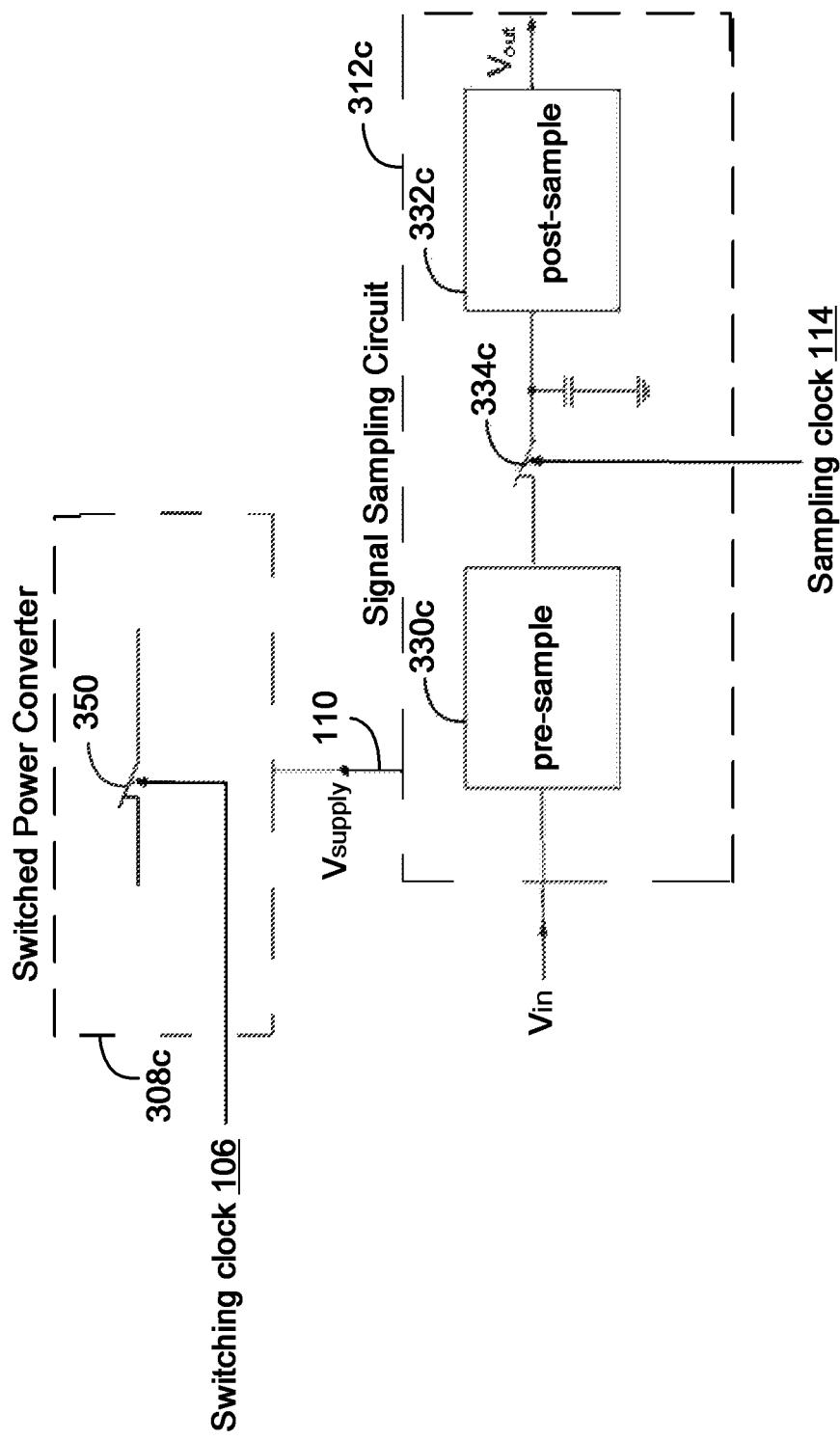
FIG. 3C is another example implementation of the anti-aliasing circuit according to one embodiment.

FIG. 3C is another example implementation of the anti-aliasing circuit according to one embodiment. The example implementation illustrated in FIG. 3C includes a switched power converter 308c, which may be an example of the switching circuit 108 (FIGS. 1A-1C), and a signal sampling circuit 312c, which may be an example of the sampling circuit 112 (FIGS. 1A-1C). The switched power converter 308c illustrated in FIG. 3C receives the switching clock signal 106, which may or may not be the modified clock signal 206 (FIGS. 2A-2B) based on the implementations discussed in connection with FIGS. 1A-1C, and performs its switching operation according to the switching clock signal 106. The switched power converter 308c illustrated in FIG. 3C includes a switch 350, and the signal sampling circuit illustrated in FIG. 3C includes a pre-sample circuit 330c, a post-sample circuit 332c, and a sampling switch 334c.

The switched power converter regulates the supply voltage $V_{supply}$ based on opening and closing one or more switches, such as FETs, based on timing of the switching clock signal 106. Examples of switched power converters include, but are not limited to, buck converters, boost converters, and charge pumps. The signal sampling circuit 112 is powered in part by the supply voltage $V_{supply}$, which can include ripples at the fundamental frequency of the switching clock signal 106 and at harmonics thereof. The clock ripples in the supply voltage $V_{supply}$ can be modulated by the sampling clock signal 114. By applying periodic phase reverse, aliased tones can be shifted outside the baseband of the signal of interest.

Although FIGS. 3A-3C illustrate three examples of electronic circuits that use phase reversal in accordance to the teachings herein, the anti-aliasing by phase reversal can be applied a wide variety of electronic circuitry. For example, the switching circuit 108 can comprise a wide variety of circuits, including, for example, an amplifier, a buffer, a filter, and/or a switched regulator. Additionally, the sampling circuit 112 can comprise any suitable circuit that includes sampling circuitry controlled by a sampling clock signal.

Figure 4A:
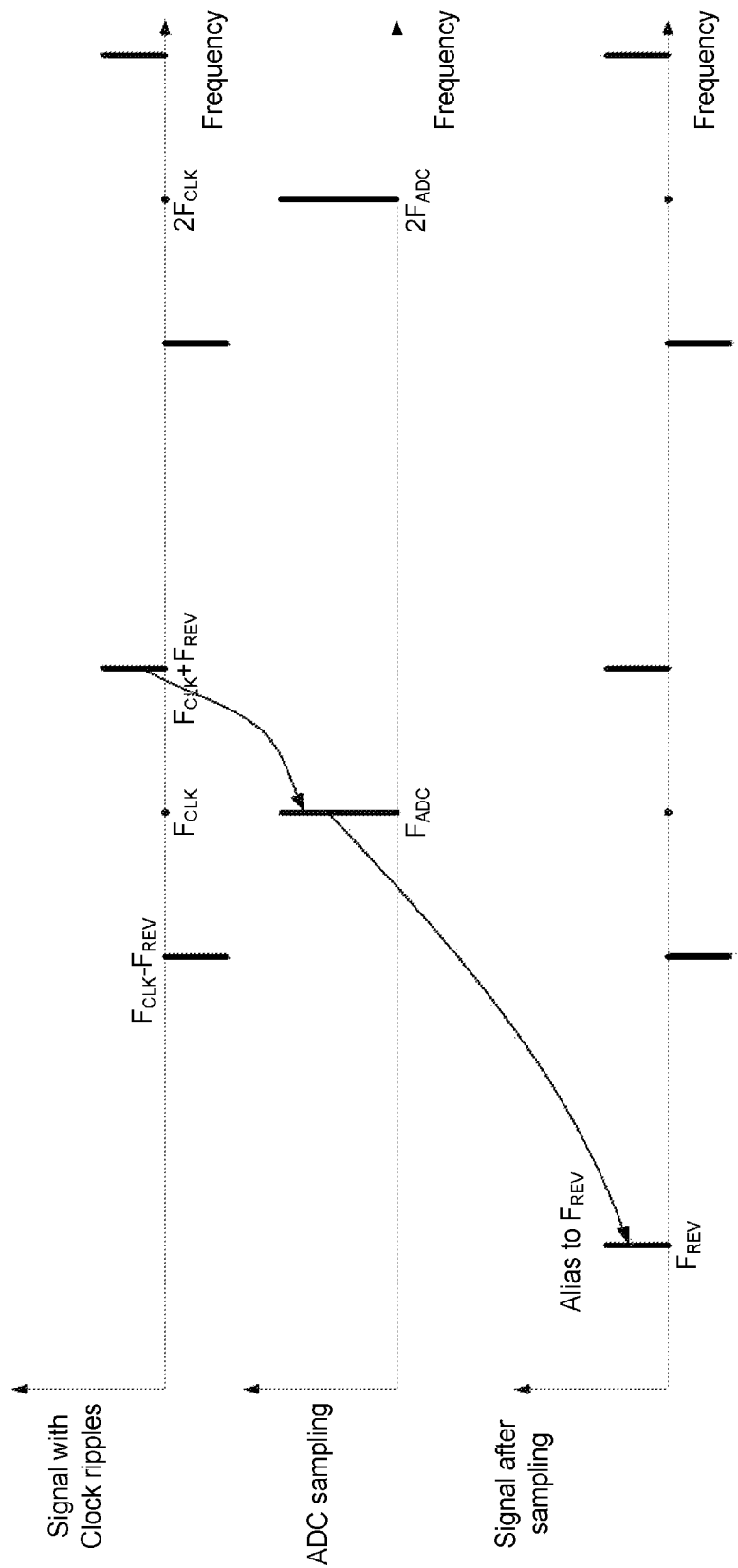
FIG. 4A illustrates frequency domain graphs of an example anti-aliasing circuit according to one embodiment.

FIG. 4A illustrates frequency domain graphs of an example anti-aliasing circuit according to one embodiment. When a circuit includes a switching block and a sampling block having a switching clock and a sampling clock respectively, unwanted coupling may result in low alias frequencies as the first clock signal can propagate and be mixed with the second clock signal. For example, without clock reversal, a switching clock signal of frequency $F_{switch}$ and a sampling clock signal of frequency $F_{sample}$ can be mixed and aliased to $F_{alias}=(k \times F_{sample}-m \times F_{switch})$, where k, m=1, 2, . . . , and can create a DC offset and frequency components at harmonic frequencies, including high magnitude frequency components in the low frequency band. By periodically reversing the phase of one or both of the switching and sampling clocks, the disclosure herein allows certain frequency components to cancel each other out so that, for example, the DC or low frequency components can be removed in a circuit in which removing DC or low aliasing frequency components is desirable.

The frequency domain graphs of FIG. 4A illustrates an example implementation of the circuit 100a (FIG. 1A), in which the switching clock signal 106 is a periodically phase-reversed version of the input clock signal 104 (FIG. 1A). The first graph of FIG. 4A shows the frequency components of the switching clock signal 106 (FIG. 1A), which is the modified clock signal 206 of FIGS. 2A-2B in this example. As previously discussed in connection with FIG. 1A, the phase reversal frequency can be $F_{REV}=F_{CLK}/N$, where N>2, and in FIGS. 4A-4B, an example implementation with N=4 is described. This phase modulation of a square wave clock signal is a multiplication of the clock square wave, with the frequency of $F_{CLK}$, by a phase reversal signal square wave, with the frequency of $F_{REV}=F_{CLK}/N$, where N=4, for example.

As illustrated in the first graph of FIG. 4A, this phase reversal performed by the clock modification circuit 102 (FIG. 1A) results in cancelling of frequency components at $F_{CLK}$ and its harmonics and introducing sideband harmonics at the frequencies $F_{CLK}+(2 \times n+1) \times F_{REV}$, where n=. . . , -2, -1, 0, 1, 2, . . . . A person of ordinary skill in the art can vary the sideband harmonics by varying N, and in turn, varying $F_{REV}$. As further described below, the choice of N can be based on the desired low frequency band of interest in a particular circuit.

The second graph of FIG. 4A illustrates frequency components of the sampling clock signal 114 (FIG. 1A) having the frequency of $F_{ADC}$. Since the switching clock signal 106 (FIG. 1A) has zero magnitude at $F_{CLK}$ and its harmonics as shown in the first graph of FIG. 4A, when the switching clock signal 106 is mixed with the sampling clock signal 114, the resulting signal after sampling has the lowest non-zero component at $F_{REV}$ as shown in the third graph of FIG. 4A. As shown in the third graph of FIG. 4A, the disclosure herein produces a zero DC component and the low frequency band below $F_{REV}$ having no aliasing frequency components. By choosing an appropriate N (and in turn, $F_{REV}$), the disclosure herein can clear the low frequency band (including the DC offset) below $F_{REV}$ of alias frequencies that could have resulted from mixing the switching and sampling clocks. Removing the low frequency band components (and the DC offset) can be advantageous, for example, in a circuit whose signal of interest (e.g., data signal) occupies the low frequency band and would benefit from not having any alias signal within that band.

Figure 4B:
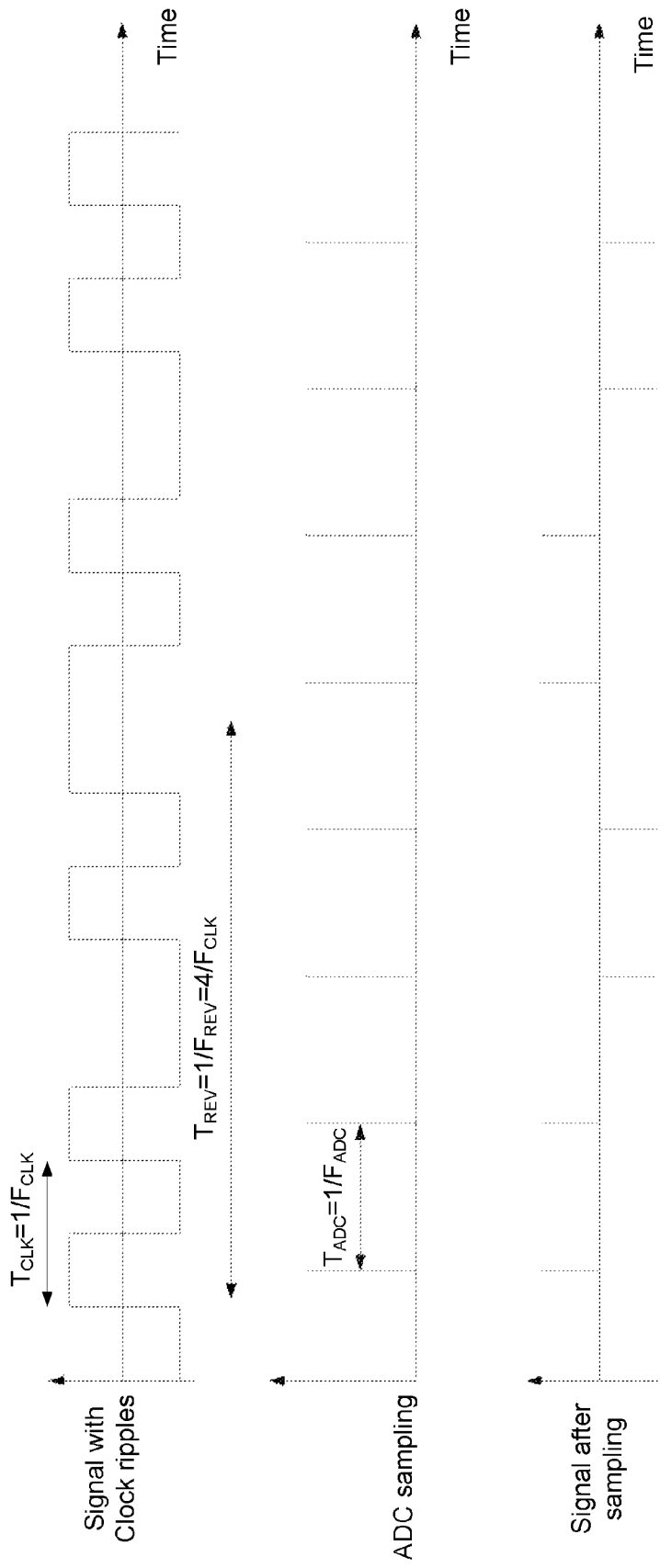
FIG. 4B illustrates time domain graphs of the example anti-aliasing circuit of FIG. 4A.

FIG. 4B illustrates time domain graphs of the example anti-aliasing circuit of FIG. 4A. The three time domain graphs of FIG. 4B respectively correspond to the frequency domain graphs of FIG. 4A, with N=4. The switching clock signal 106 (FIG. 1A), which is the modified clock signal 206 (FIGS. 2A-2B) in this example, has its phase reversed at every phase reversal period, $T_{REV}$, which is $1/F_{REV}=4/F_{CLK}$. When the switching clock signal 106 (FIG. 1A) is mixed with the sampling clock signal 114 (FIG. 1A), the resulting signal after sampling in the time domain has no DC offset as shown in the third graph of FIG. 4B. Although FIGS. 4A-4B illustrates an example implementation depicted in FIG. 1A, similar advantages may result from implementing the embodiments depicted in FIGS. 1B and 1C with appropriate choice of one or more clock reversal frequencies.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Applications

Furthermore, the disclosed methods, systems, and/or apparatus can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, wireless devices, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus comprising:
a switching circuit configured to receive a first clock signal and to generate an output signal, wherein the switching circuit comprises a first switch configured to receive the first clock signal, wherein the first clock signal is configured to control a switching operation of the switching circuit;
a sampling circuit configured to receive a second clock signal and the output signal, wherein the sampling circuit comprises a second switch configured to receive the second clock signal, wherein the second clock signal is configured to control a sampling operation of the sampling circuit; and
a first clock modification circuit configured to receive a first input clock signal and to generate a first modified clock signal by periodically reversing a phase of the first input clock signal, wherein the first modified clock signal comprises either the first clock signal or the second clock signal.

2. The apparatus of claim 1, further comprising:
a second clock modification circuit configured to receive a second input clock signal and to generate a second modified clock signal by periodically reversing a phase of the second input clock signal,
wherein the first modified clock signal comprises the first clock signal and the second modified clock signal comprises the second clock signal,
wherein a frequency of periodically reversing the phase of the first input clock signal is different from a frequency of periodically reversing the phase of the second input clock signal.

3. The apparatus of claim 1, wherein the first clock signal and the second clock signal are synchronized.

4. The apparatus of claim 1, wherein the switching circuit comprises at least one of a chopping amplifier or an auto-zero amplifier.

5. The apparatus of claim 1, wherein the switching circuit comprises a switched power converter.

6. The apparatus of claim 1, wherein the sampling circuit comprises an analog-to-digital converter (ADC).

7. The apparatus of claim 1, wherein a frequency of periodically reversing the phase of the first input clock signal is based on a frequency of the first input clock signal.

8. The apparatus of claim 7, wherein the first clock modification circuit comprises:
a phase reverse circuit configured to generate a phase reverse signal based on the frequency of the first input clock signal; and
a logic circuit configured to generate the first modified clock signal based on the first clock signal and the phase reverse signal.

9. The apparatus of claim 8, wherein the phase reverse circuit comprises a frequency divider configured to provide division by an integer factor greater than 2.

10. The apparatus of claim 8, wherein the logic circuit comprises an exclusive OR (XOR) circuit.

11. The apparatus of claim 7, wherein the frequency of periodically reversing the phase of the first input clock signal is less than ½ times the frequency of the first input clock signal.

12. A method comprising:
receiving a first clock signal as an input to a switching circuit;
controlling a switching operation of the switching circuit using the first clock signal;
generating an output signal of the switching circuit based on the switching operation;
receiving a second clock signal and the output signal as inputs to a sampling circuit;
controlling a sampling operation of the sampling circuit using the second clock signal; and
generating a first modified clock signal based on periodically reversing a phase of a first input clock signal, wherein the first modified clock signal comprises either the first clock signal or the second clock signal.

13. The method of claim 12 further comprising:
generating a second modified clock signal based on periodically reversing a phase of a second input clock signal,
wherein the first modified clock signal comprises the first clock signal and the second modified clock signal comprises the second clock signal,
wherein a frequency of periodically reversing the phase of the first input clock signal is different from a frequency of periodically reversing the phase of the second input clock signal.

14. The method of claim 12, wherein an alias frequency of the output signal of the switching circuit is shifted outside the baseband of a signal of interest.

15. The method of claim 12, further comprising synchronizing the first clock signal and the second clock signal.

16. The method of claim 12, wherein generating the first modified clock signal based on periodically reversing the phase of the first input clock signal comprises periodically reversing the phase of the first input clock signal based on the frequency of the first input clock signal.

17. The method of claim 16 further comprising:
generating a phase reverse signal based on the frequency of the first input clock signal; and
generating the first modified clock signal based on the first clock signal and the phase reverse signal.

18. The method of claim 16, wherein the frequency of periodically reversing the phase of the first input clock signal is less than ½ times the frequency of the first input clock signal.

19. An apparatus comprising:
a means for receiving a first clock signal, wherein the first clock signal is configured to control a switching operation;
a means for generating an output signal from the switching operation based in part on the first clock signal;
a means for receiving a second clock signal and the output signal, wherein the second clock signal is configured to control a sampling operation; and
a means for receiving a first input clock signal and periodically reversing a phase of the first input clock signal to generate a first modified clock signal, wherein the first modified clock signal comprises either the first clock signal or the second clock signal.

20. The apparatus of claim 19 further comprising:
a means for receiving a second input clock signal and periodically reversing a phase of the second input clock signal to generate a second modified clock signal,
wherein the first modified clock signal comprises the first clock signal and the second modified clock signal comprises the second clock signal,
wherein a frequency of periodically reversing the phase of the first input clock signal is different from a frequency of periodically reversing the phase of the second input clock signal.

* * * * *